(12) United States Patent
Reipen et al.

(10) Patent No.: US 7,892,344 B2
(45) Date of Patent: Feb. 22, 2011

(54) P.R. 254 PIGMENT PREPARATION FOR USE IN COLOR FILTERS

(75) Inventors: Tanja Reipen, Mainz (DE); Jens Reichwagen, Wiesbaden (DE); Lars Schneider, Kriftel (DE); Carsten Plueg, Muehltal/Niederbeerbach (DE); David Blum, Sao Paulo (BR)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 12/497,007

(22) Filed: Jul. 2, 2009

(65) Prior Publication Data

US 2010/0006009 A1   Jan. 14, 2010

(30) Foreign Application Priority Data

Jul. 8, 2008   (DE)   ........................ 10 2008 032 090

(51) Int. Cl.
| | |
|---|---|
| C09B 67/20 | (2006.01) |
| C09B 67/00 | (2006.01) |
| C09B 67/22 | (2006.01) |
| C09D 5/32 | (2006.01) |
| C09D 5/36 | (2006.01) |
| C09D 7/12 | (2006.01) |
| C09D 11/00 | (2006.01) |
| G02B 5/22 | (2006.01) |
| G03F 7/00 | (2006.01) |
| G03G 9/09 | (2006.01) |

(52) U.S. Cl. .................. 106/498; 106/31.28; 106/31.65; 106/31.77; 106/31.78; 106/31.79; 106/31.9; 106/493; 106/494; 106/495; 106/496; 106/497; 106/499; 430/7; 430/108.2; 430/108.21; 524/87; 524/105

(58) Field of Classification Search .............. 106/31.28, 106/31.65, 31.77, 31.78, 31.79, 31.8, 493, 106/494, 495, 496, 497, 498, 499; 430/7, 430/108.2, 108.21; 524/87, 105

See application file for complete search history.

(56) References Cited

U.S. PATENT DOCUMENTS

| | | | |
|---|---|---|---|
| 4,310,359 A | | 1/1982 | Ehashi et al. |
| 5,869,625 A * | | 2/1999 | Jaffe et al. ...................... 8/639 |
| 6,911,074 B2 * | | 6/2005 | Grandidier et al. .......... 106/498 |
| 6,911,075 B2 * | | 6/2005 | Grandidier et al. .......... 106/499 |
| 6,918,958 B2 * | | 7/2005 | Weber et al. ................. 106/493 |
| 7,045,637 B2 | | 5/2006 | Weber et al. |
| 7,045,638 B2 | | 5/2006 | Weber et al. |
| 7,102,014 B2 | | 9/2006 | Weber et al. |
| 7,153,358 B2 | | 12/2006 | Weber et al. |
| 7,431,762 B2 | | 10/2008 | Minashima et al. |
| 7,655,087 B2 * | | 2/2010 | Hoshino et al. ............. 106/496 |
| 2001/0008912 A1 * | | 7/2001 | Weber et al. .................. 524/92 |
| 2003/0162976 A1 | | 8/2003 | Weber et al. |
| 2003/0162977 A1 | | 8/2003 | Weber et al. |
| 2004/0177790 A1 | | 9/2004 | Weber et al. |
| 2004/0250732 A1 * | | 12/2004 | Grandidier et al. .......... 106/410 |
| 2004/0250733 A1 * | | 12/2004 | Grandidier et al. .......... 106/410 |
| 2006/0052490 A1 | | 3/2006 | Weber et al. |
| 2006/0185558 A1 * | | 8/2006 | Saikatsu et al. ............. 106/493 |
| 2008/0022902 A1 | | 1/2008 | Minashima et al. |
| 2008/0107977 A1 * | | 5/2008 | Hoshino et al. ................ 430/7 |
| 2008/0194742 A1 | | 8/2008 | Ganschow et al. |
| 2009/0048375 A1 * | | 2/2009 | Deroover ..................... 524/90 |
| 2009/0142681 A1 * | | 6/2009 | Reipen et al. ............ 430/108.2 |
| 2009/0152517 A1 * | | 6/2009 | Takiguchi et al. ........... 252/586 |
| 2009/0169887 A1 * | | 7/2009 | Reipen et al. ............... 428/402 |
| 2009/0241802 A1 * | | 10/2009 | Nemoto et al. .............. 106/498 |
| 2010/0062357 A1 * | | 3/2010 | Ganschow et al. ...... 430/108.21 |

FOREIGN PATENT DOCUMENTS

| | | | |
|---|---|---|---|
| DE | 3106906 | | 1/1982 |
| DE | 10235573 | | 2/2004 |
| DE | 10 2007 011 066 A1 | * | 9/2008 |
| EP | 1104789 | | 6/2001 |
| EP | 1 715 007 A2 | * | 10/2006 |
| EP | 1884543 | | 2/2008 |
| EP | 2146230 | | 1/2010 |
| JP | 2001-214107 A | * | 8/2001 |
| JP | 2005345884 | | 12/2005 |
| JP | 2007-224177 A | * | 9/2007 |

OTHER PUBLICATIONS

Co-pending U.S. Appl. No. 12/738,082 by Reipen et al. filed Apr. 15, 2010.
English Abstract for EP 2146230, Jan. 20, 2010.
EPO Search Report for EP 09007597, mailed Aug. 19, 2010.
Database WPI Week 200603 Thompson Scientific, London, GB; An 2006-025329, XP002597303 and JP 2005345884. [Dec. 2005].

* cited by examiner

Primary Examiner—Anthony J Green
(74) Attorney, Agent, or Firm—Anthony A. Bisulca

(57) ABSTRACT

The invention provides a pigment preparation comprising
(a) C.I. Pigment Red 254 with an average particle size $d_{50}$ of not more than 100 nm;
(b) 0.1% to 30% by weight, based on the weight of the PR 254, of one or more dispersants from the group of the unlaked sulfo-containing monoazo dyes; and
(c) 0.1% to 30% by weight, based on the weight of the PR 254, of a basic pigment dispersant of the formula (V)

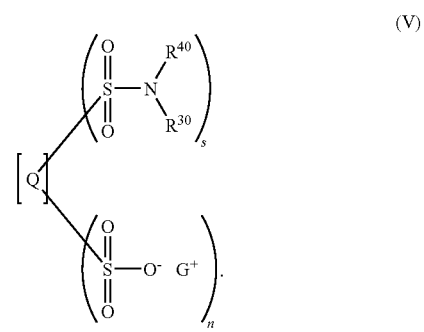

8 Claims, No Drawings

P.R. 254 PIGMENT PREPARATION FOR USE IN COLOR FILTERS

The present invention is described in the German priority application No. 10 2008 032 090.0, filed Jul. 8, 2008, which is hereby incorporated by reference as is fully disclosed herein.

The present invention relates to a new pigment preparation comprising finely divided P.R. 254 and certain pigment dispersants, and also to the use of this new product as a pigment.

There are many uses of organic pigments where very good dispersibility, low viscosity, and high storage stability are required, as for example in the coloring of metallic coatings or the use in color filters.

In respect of color filters, the spincoating operation uses highly mobile, stable pigment suspensions to allow the color filter coating to be produced with a consistent coat thickness.

Color filters are produced using particularly finely divided pigments in order that particle scattering, which leads to a reduction in contrast ratio, may be largely obviated.

Contrast ratio (CR) is measured by determining the light intensity after irradiation through a pigmented coating layer on a transparent substrate positioned between two polarizers. Contrast ratio is the ratio of the light intensities for parallel and perpendicular polarizers.

$$CR = \frac{\text{Light intensity (parallel)}}{\text{Light intensity (perpendicular)}}$$

Commercially available products, however, do not always meet all of the technical requirements. More particularly there was a need for improvement with regard to dispersibility and the viscosity and storage stability of these finely divided pigments, without adverse effect on chroma and hue.

U.S. Pat. No. 5,869,625 describes mixtures of opaque DPP pigments and salt-forming azo pigments for automobile finish applications.

JP 2001 214107 describes a composition of pigments, salt-forming azo pigments, and a cationic dispersing assistant for liquid writing inks.

EP-A-1 715 007 describes the use of disazo condensation dispersants based on C.I. Pigment Red 242 for application in color filters.

US 2006 185558 A describes the use of a mixture of sulfo-containing DPP pigments, sulfo-free DPP pigments, and disazo condensation dispersants based on C.I. Pigment Red 242 for application in color filters.

US 2008 0107977 describes transparent pigment compositions for color filters with salt-forming azo synergists.

Since the demands on pigments for color filter applications, for example, are increasing all the time, the properties of the known pigment compositions are inadequate for top-grade pigments. Need for improvement exists in particular with respect to dispersibility, viscosity, and storage stability.

The object was to provide a diketopyrrolopyrrole pigment preparation, more particularly for color filter applications, which exhibits effective dispersibility, a stable and low viscosity in organic coating systems, and a high contrast value.

It has been found that a mixture of a P.R. 254 and at least one dispersant from the group of the unlaked sulfo-containing monoazo dyes, and a further basic dispersant, surprisingly achieves this object.

The invention provides a pigment preparation comprising (a) C.I. Pigment Red 254 with an average particle size $d_{50}$ of not more than 100 nm, e.g., 20 to 100 nm, more particularly 30 to 80 nm;

(b) 0.1% to 30% by weight, preferably 1% to 25% by weight, based on the weight of the P.R. 254, of one or more dispersants from the group of the unlaked sulfo-containing monoazo dyes of the formula (I), (II), (III) or (IV)

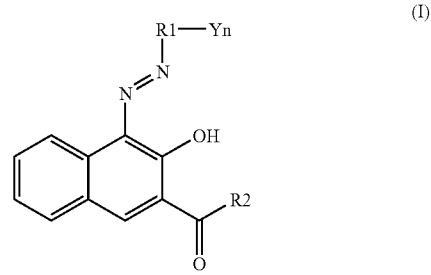

(I)

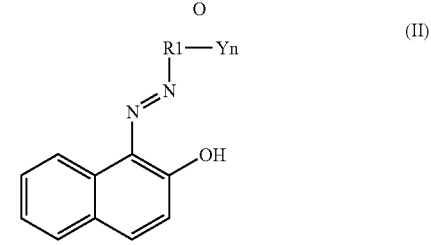

(II)

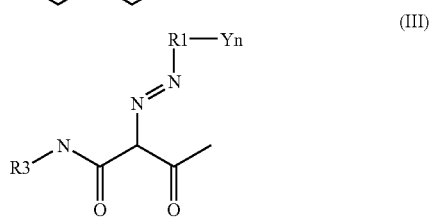

(III)

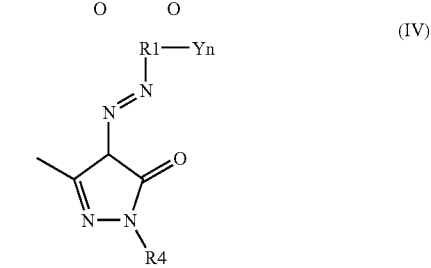

(IV)

in which

R1 is an aromatic radical having 1, 2 or 3 aromatic rings, it being possible for the rings to be fused or to be linked by a bond, or a heterocyclic radical having 1, 2 or 3 rings containing 1, 2, 3 or 4 heteroatoms from the group consisting of O, N, and S; or a combination thereof;

it being possible for the stated aromatic and heteroaromatic radicals to be substituted by 1, 2, 3 or 4 substituents from the group consisting of OH, CN, F, Cl, Br, $NO_2$, $CF_3$, $C_1$-$C_6$-alkoxy, S—$C_1$-$C_6$-alkyl, $NHCONH_2$, NHC(NH)$NH_2$, NHCO—$C_1$-$C_6$-alkyl, $C_1$-$C_6$-alkyl, COOR5, CONR5R6, NR5R6, $SO_3$R5, $SO_2$—NR5R6 or COO$^-$E$^+$, R5 and R6 being alike or different and being hydrogen, phenyl or $C_1$-$C_6$-alkyl, and E$^+$ being hydrogen, lithium, sodium, potassium, rubidium, cesium or an unsubstituted ammonium ion;

Y is $SO_3^-$E$^+$ or Z-$SO_3^-$E$^+$, Z being $C_1$-$C_{10}$-alkylene or phenylene;

n is a number 1, 2 or 3;

R2 is —OR$^8$ or —NHR$^8$, where R⁸ has the definition H, $C_1$-$C_6$-alkyl, benzyl, an aromatic radical having 1, 2 or 3 aromatic rings, it being possible for the rings to be fused or to be linked by a bond, or a heterocyclic radical having 1, 2 or 3 rings containing 1, 2, 3 or 4 heteroatoms from the group consisting of O, N, and S; or a combination thereof;

it being possible for the stated aromatic and heteroaromatic radicals to be substituted in each case by 1, 2, 3 or 4 substituents from the group consisting of OH, $C_1$-$C_6$-alkoxy, S—$C_1$-$C_6$-alkyl, halogen, such as F, Cl, Br, $NHCONH_2$, $NHC(NH)NH_2$, NHCO—$C_1$-$C_6$-alkyl, $C_1$-$C_6$-alkyl, nitro, COOR5, CONR5R6, $SO_3$R5, $SO_2$—NR5R6, $NR^9R^{10}$, $SO_3^-E^+$ or $COO^-E^+$, R5 and R6 being alike or different and being hydrogen, phenyl or $C_1$-$C_6$-alkyl; $R^9$ and $R^{10}$ are alike or different and are hydrogen, phenyl or $C_1$-$C_6$-alkyl;

R3 and R4 are each an aromatic radical having 1, 2 or 3 aromatic rings, it being possible for the rings to be fused or to be linked by a bond, or a heterocyclic radical having 1, 2 or 3 rings containing 1, 2, 3 or 4 heteroatoms from the group consisting of O, N, and S; or a combination thereof;

it being possible for the stated aromatic and heteroaromatic radicals to be substituted in each case by 1, 2, 3 or 4 substituents from the group consisting of OH, $C_1$-$C_6$-alkoxy, S—$C_1$-$C_6$-alkyl, halogen, such as F, Cl, Br, $NHCONH_2$, $NHC(NH)NH_2$, NHCO—$C_1$-$C_6$-alkyl, $C_1$-$C_6$-alkyl, nitro, COOR5, CONR5R6, $SO_3$R5, $SO_2$—NR5R6, $NR^9R^{10}$, $SO_3^-E^+$ or $COO^-E^+$, R5 and R6 being alike or different and being hydrogen, phenyl or $C_1$-$C_6$-alkyl; $R^9$ and $R^{10}$ are alike or different and are hydrogen, phenyl or $C_1$-$C_6$-alkyl;

0.1% to 30% by weight, preferably 1% to 25% by weight, based on the weight of the PR 254, of a basic pigment dispersant of the formula (5)

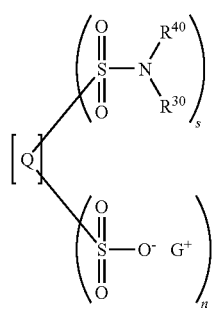

(5)

in which

Q is a radical of an organic pigment from the group of the perinone, quinacridone, quinacridonequinone, anthanthrone, indanthrone, dioxazine, diketopyrrolopyrrole, indigo, thioindigo, thiazineindigo, isoindoline, isoindolinone, pyranthrone, isoviolanthrone, flavanthrone or anthrapyrimidine pigments;

s is a number from 1 to 5, preferably 1 to 3;

n is a number from 0 to 4, preferably 0, 1 or 2; the sum of s and n is 1 to 5, and s is greater than n;

$R^{30}$ is a branched or unbranched, saturated or unsaturated, aliphatic hydrocarbon radical having 1 to 20 carbon atoms, or a $C_5$-$C_7$-cycloalkyl radical, or an araliphatic or aromatic radical having 1, 2 or 3 aromatic rings, it being possible for the rings to be fused or to be linked by a bond, or a heterocyclic radical having 1, 2 or 3 rings containing 1, 2, 3 or 4 heteroatoms from the group consisting of O, N and S, or a combination thereof; the stated hydrocarbon, cycloalkyl, aromatic, araliphatic, and heteroaromatic radicals may be substituted by 1, 2, 3 or 4 substituents from the group consisting of OH, CN, F, Cl, Br, $NO_2$, $CF_3$, $C_1$-$C_6$-alkoxy, S—$C_1$-$C_6$-alkyl, $NHCONH_2$, $NHC(NH)NH_2$, NHCO—$C_1$-$C_6$-alkyl, $C_1$-$C_6$-alkyl, $CONR^5R^6$, $NR^5R^6$ and $SO_2$—$NR^5R^6$, $R^5$ and $R^6$ being alike or different and being hydrogen, phenyl or $C_1$-$C_6$-alkyl, with the proviso that there is at least one basic amino group in the stated hydrocarbon, cycloalkyl, aromatic, araliphatic or heteroaromatic radicals;

$R^{40}$ is hydrogen or $R^{30}$;

$G^+$ has the definition of $H^+$, alkali metal or substituted or unsubstituted ammonium ion.

The weight ratio of components (b) and (c) to one another is preferably approximately 1:1, i.e., 1:0.8 to 1.2.

In the monoazo dyes of component (b) the radical —R1-Yn has the following preferred definitions, the free valence on the phenyl ring or naphthyl ring representing the bond to the diazo group:

(i) from the group of the p-aminobenzenesulfonic acids:

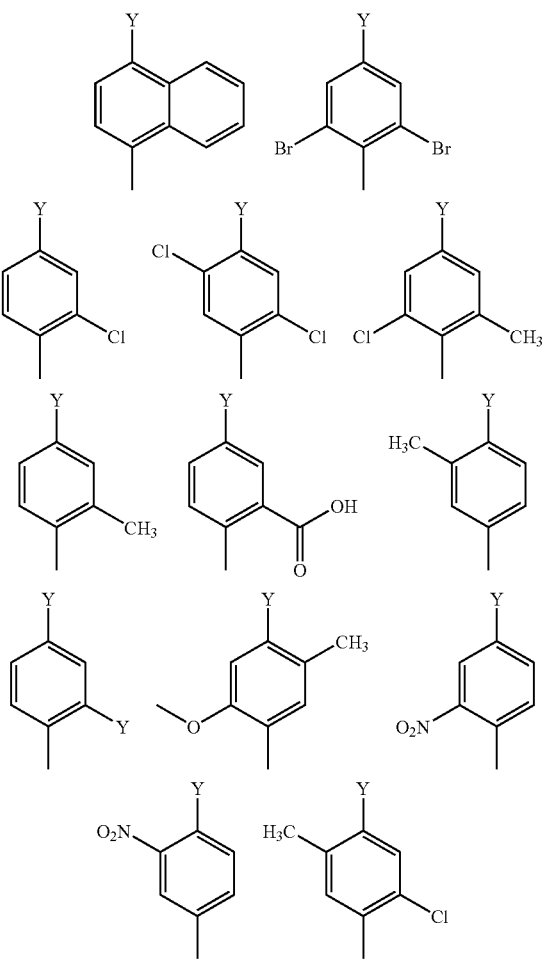

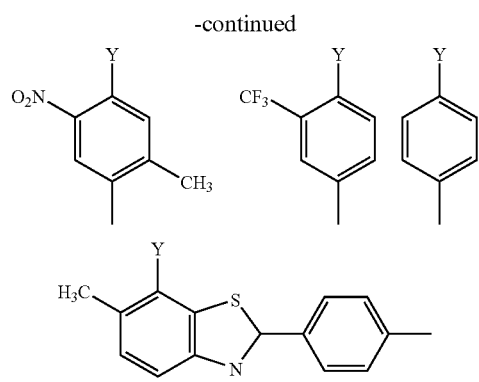
(ii) from the group of the m-aminobenzenesulfonic acids:
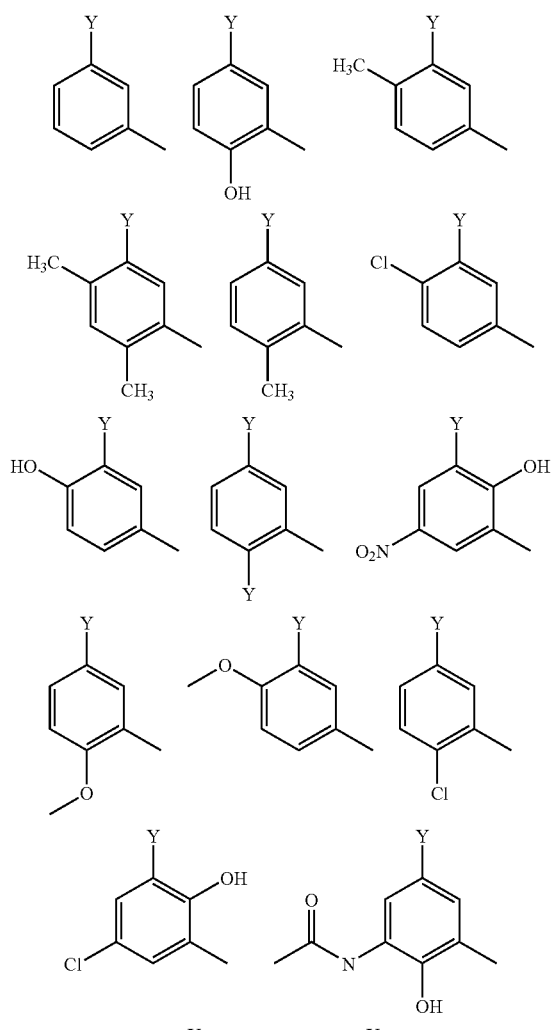
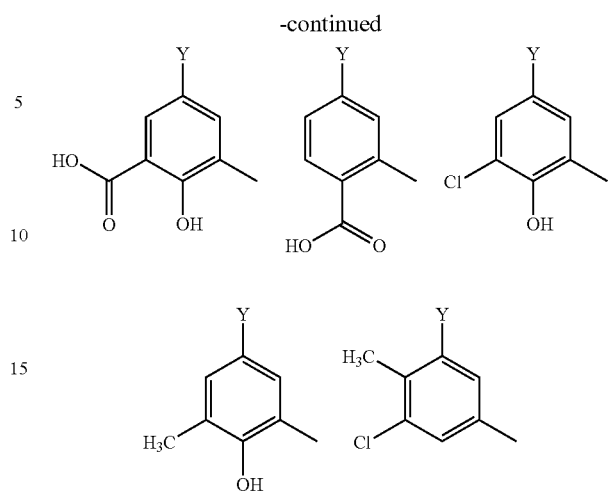
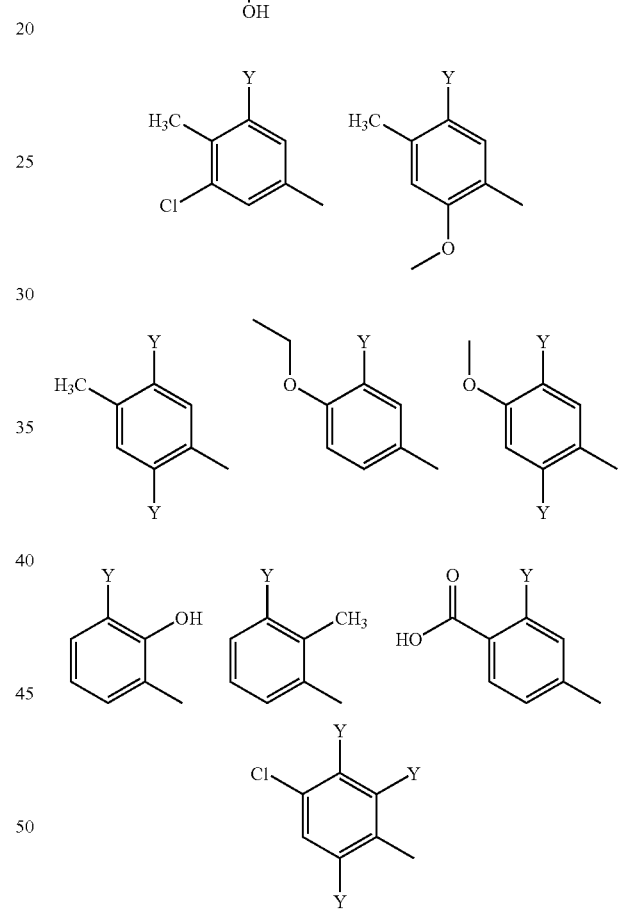
(iii) from the group of the o-aminobenzenesulfonic acids:
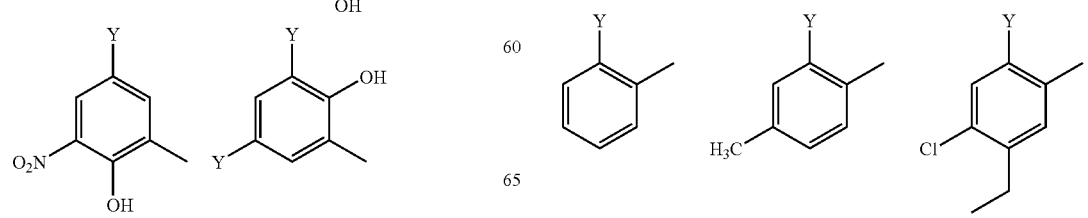

-continued
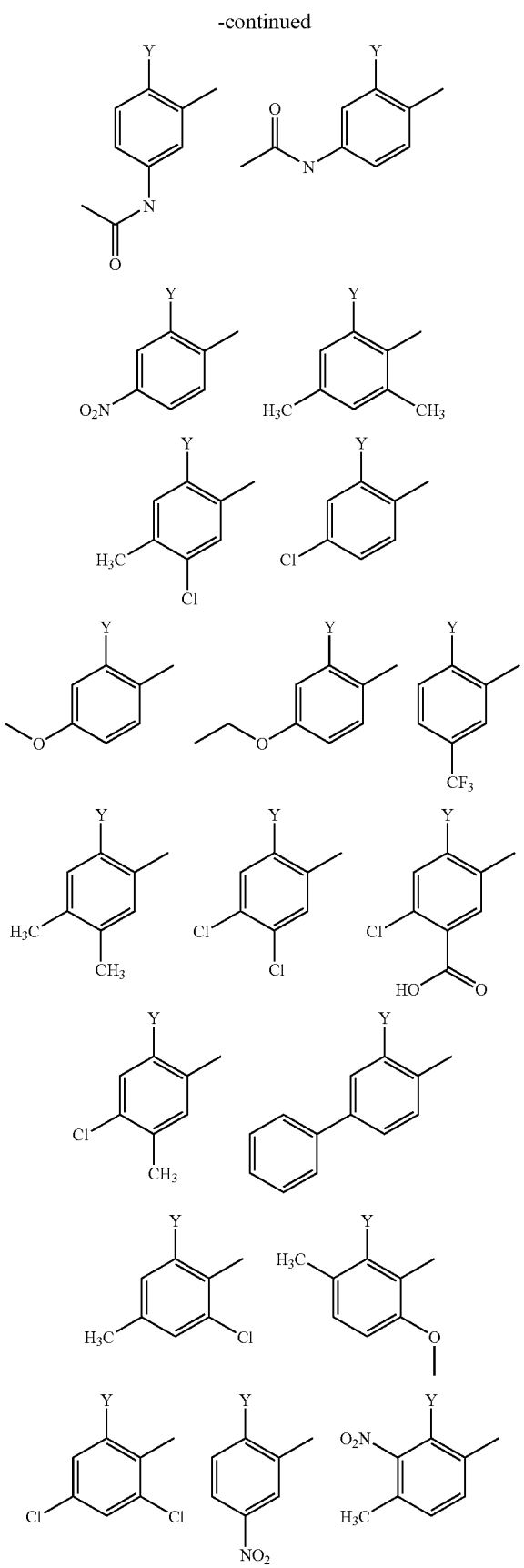
-continued
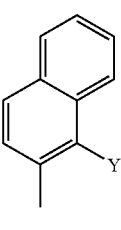
Particularly preferred radicals from the group —R1-Yn are:
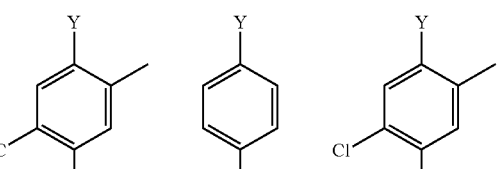
Preferred compounds of the formula (I) for the purposes of the invention:
In a first embodiment the radical —R2 has the definition OH or O—$C_1$-$C_6$-alkyl.
In one alternative embodiment the radical —CO—R2 is an amide group where R2 is $NH_2$.
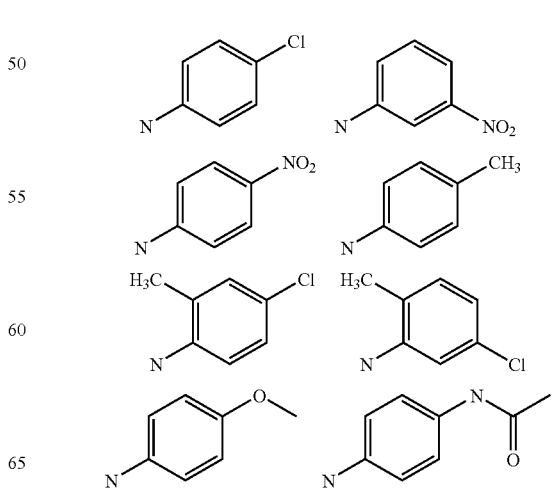

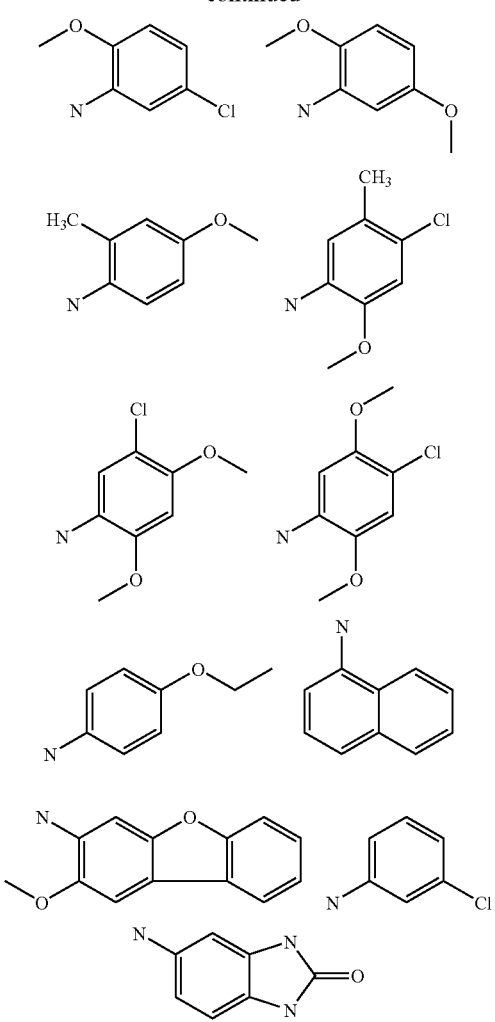

and in the above formulae the bond to the carbonyl group is via the free amino group (N—) of the aromatic ring.

Particularly preferred radicals from the group —R2 are:

OH on the one hand and also

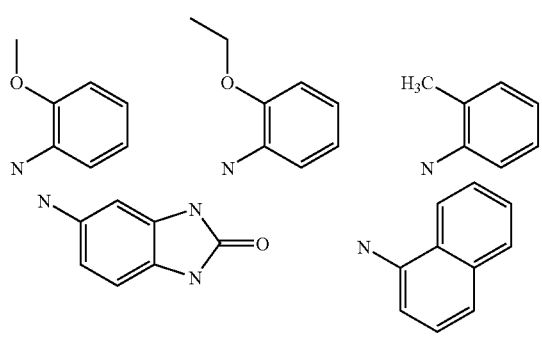

Preferred compounds of the formula (III) for the purposes of the invention are those having the following radicals —R3, the free valence on the phenyl ring representing the bond to the nitrogen:

Particularly preferred radicals from the group —R3 are:

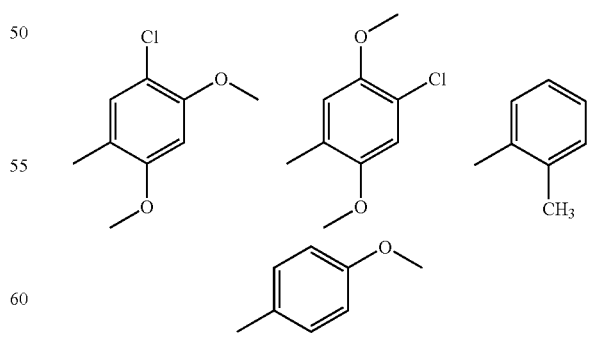

Preferred compounds of the formula (IV) for the purposes of the invention are those having the following radicals —R4, the free valence on the phenyl ring representing the bond to the nitrogen:

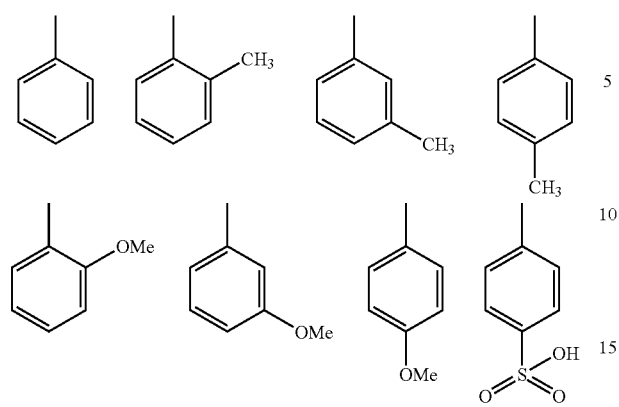
Particularly preferred radicals from the group —R4 are:
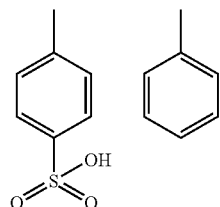
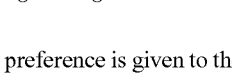
Very particular preference is given to the monoazo dyes of the formulae:
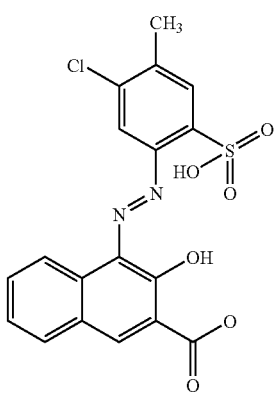
(VI)
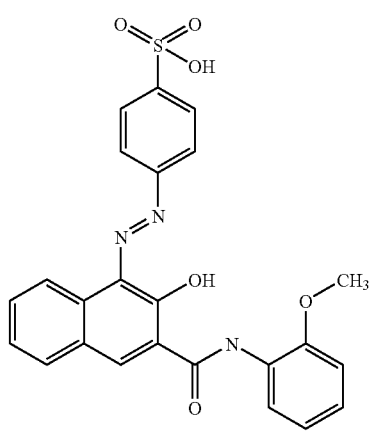
(VII)
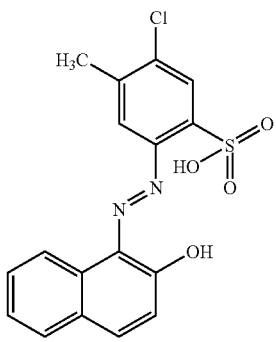
(VIII)
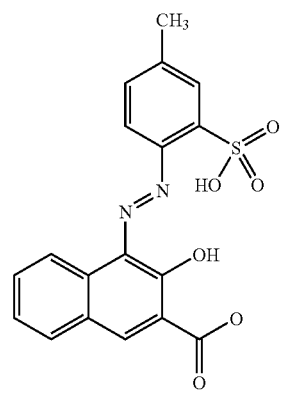
(IX)
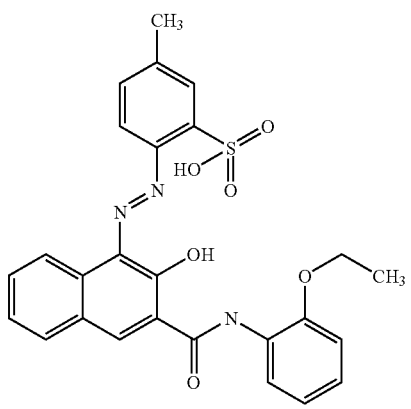
(X)
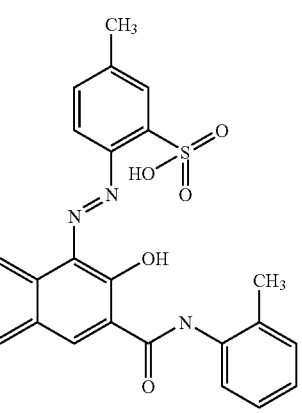
(XI)

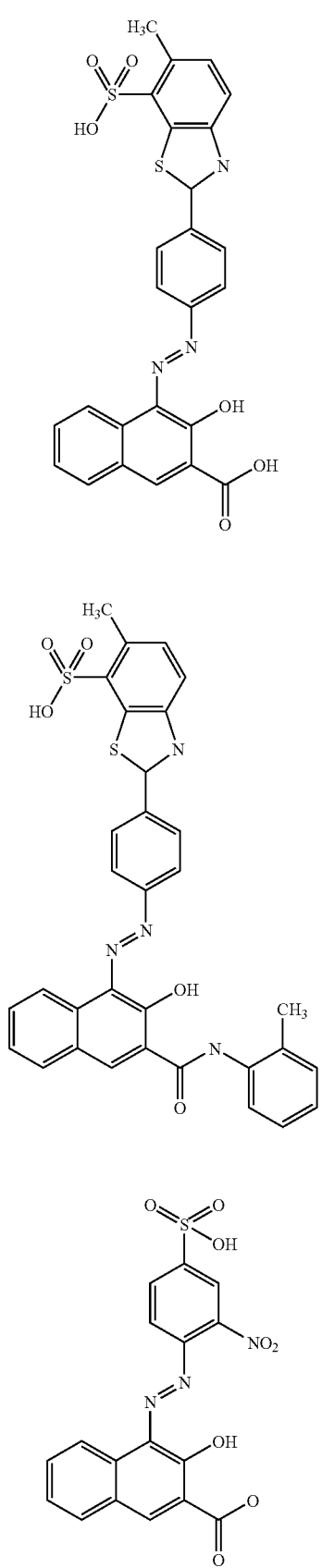
(XII)
(XIII)
(XIV)
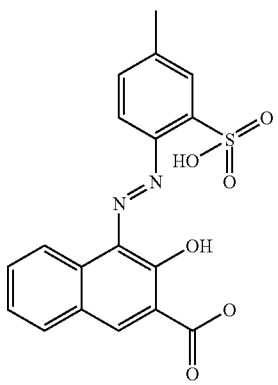
(XV)
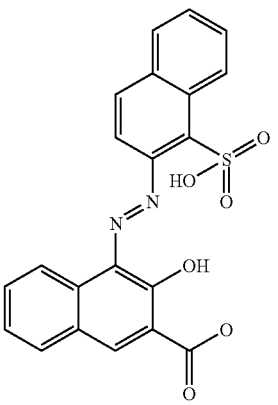
(XVI)
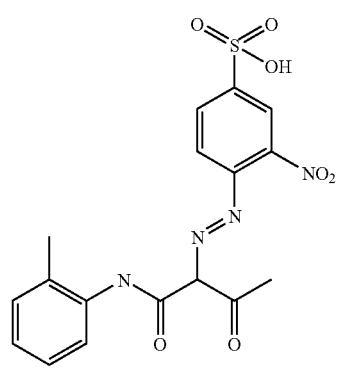
(XVII)
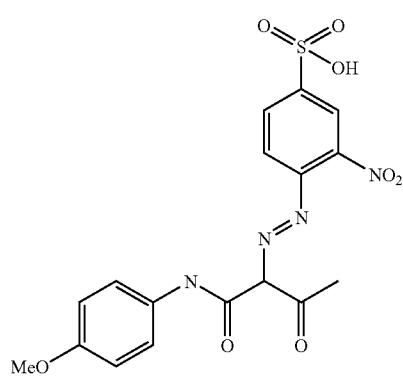
(XVIII)

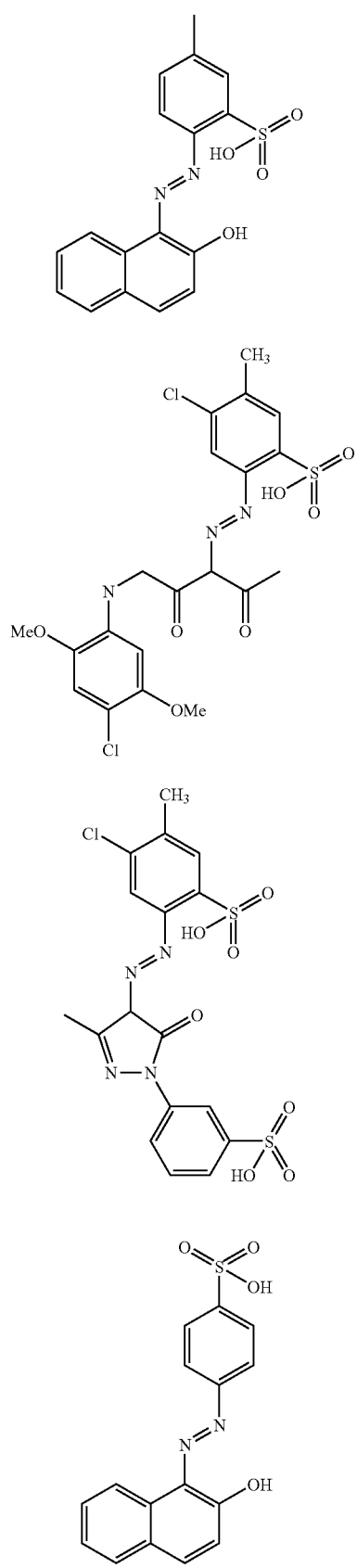
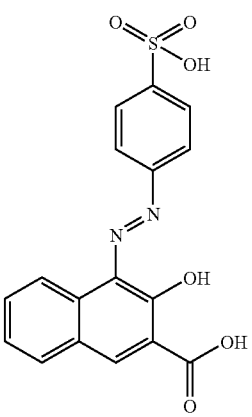
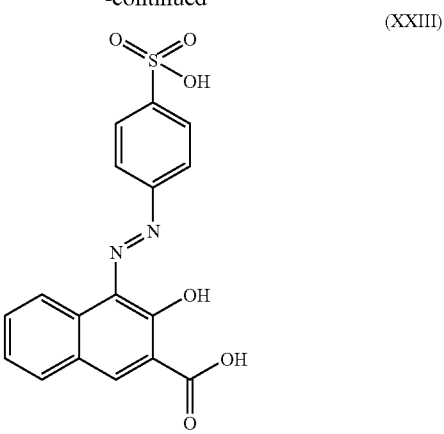

The unlaked sulfo-containing monoazo dyes are compounds that are known per se and can be prepared according to known methods by diazotization and azo coupling.

In preferred pigment dispersants of the formula (5)

Q is a radical of an organic pigment from the group of the quinacridone, dioxazine or diketopyrrolopyrrole pigments;

$R^{30}$ is $C_1$-$C_6$-alkyl substituted by $NR^5R^6$, $R^5$ and $R^6$ being alike or different and being hydrogen, phenyl or $C_1$-$C_6$-alkyl;

$R^{40}$ is hydrogen;

$G^+$ is hydrogen, Li, Na, K or an ammonium ion.

In particularly preferred pigment dispersants of the formula (5)

Q is a radical of an organic pigment from the group of the diketopyrrolopyrrole pigments, preferably C.I. Pigment Red 255 or 264, or of the quinacridone pigments, preferably C.I. Pigment Violet 19 or Pigment Red 122;

$R^{30}$ is $C_2$-$C_4$-alkyl substituted by $NR^5R^6$, $R^5$ and $R^6$ being alike or different and being hydrogen or $C_1$-$C_4$-alkyl;

$R^{40}$ is hydrogen; and $G^+$ is hydrogen, Li, Na, K or an ammonium ion.

The pigment dispersants of the formula (5) are compounds that are known per se and can be prepared according to known methods, in accordance for example with EP-A-1 104 789 or DE-A-3 106 906.

The process conditions, reagents, solvents, and starting compounds employed for preparing the diketopyrrolopyrrole pigment are known to a person skilled in the art.

The invention also provides a process for producing the pigment preparation of the invention, which comprises admixing P.R. 254, during and/or after conversion to a fine state of subdivision, such as, for example, kneading, wet grinding, dry grinding, or during and/or after a finishing treatment, with the unlaked sulfo-containing monoazo dye and the pigment dispersant of the formula (5).

Preference is given to addition during conversion to a fine state of subdivision.

The respective components can be used in dry form, as for example in granule or powder form, or in moist form, as for example as press cakes.

One preferred form of conversion to a fine stage of subdivision for the P.R. 254 is that of salt kneading with a crystalline inorganic salt in the presence of an organic solvent.

Suitable crystalline inorganic salts include, for example, aluminum sulfate, sodium sulfate, calcium chloride, potassium chloride or sodium chloride, preferably sodium sulfate, sodium chloride, and potassium chloride.

Examples of suitable organic solvents include ketones, esters, amides, sulfones, sulfoxides, nitro compounds, mono-, bis- or tris-hydroxy-$C_2$-$C_{12}$-alkanes, which may be substituted by $C_1$-$C_8$-alkyl and one or more hydroxyl groups. Particular preference is given to water-miscible high-boiling organic solvents based on monomeric, oligomeric, and polymeric $C_2$-$C_3$-alkylene glycols, such as diethylene glycol, diethylene glycol monomethyl and monoethyl ethers, triethylene glycol, triethylene glycol monomethyl and monoethyl ethers, dipropylene glycol, dipropylene glycol monomethyl and monoethyl ethers, propylene glycol monomethyl and monoethyl ethers, and liquid polyethylene glycols and polypropylene glycols, N-methylpyrrolidone, and also, furthermore, triacetin, dimethylformamide, dimethylacetamide, ethyl methyl ketone, cyclohexanone, diacetone alcohol, butyl acetate, nitromethane, dimethyl sulfoxide, and sulfolane.

The weight ratio between the inorganic salt and the pigment is preferably (2 to 10):1, more particularly (3 to 7):1.

The weight ratio between the organic solvent and the inorganic salt is preferably (1 ml:10 g) to (2 ml:7 g).

The weight ratio between the organic solvent and the sum of inorganic salt and pigment is preferably (1 ml:2 g) to (1 ml:10 g).

The temperature in the course of kneading may be between 40 and 140° C., preferably 60 to 120° C. The kneading time is advantageously 4 h to 32 h, preferably 8 h to 20 h.

After the salt kneading operation, the inorganic salt and the organic solvent are advantageously removed by washing with water, and the resulting pigment composition is dried by customary methods.

The material obtained after the inventive conversion to a fine state of subdivision, in the form of a suspension, filter cake or dry material, may where appropriate be subjected to a solvent aftertreatment in order to obtain a more homogeneous particle morphology without a substantial increase in particle size. Preference is given to the use of water or steam-volatile solvents such as alcohols and aromatic solvents, more preferably branched or unbranched $C_1$-$C_6$ alcohols, toluene, xylene, chlorobenzene, dichlorobenzene, nitrotoluene or nitrobenzene, usually at an elevated temperature, as for example up to 200° C., and under elevated pressure where appropriate.

It is also possible to carry out one or more of the stated process steps for producing the pigment preparations of the invention in a microreactor.

The pigment preparation of the invention may additionally comprise further, customary auxiliaries or additives, examples being surfactants, dispersants, fillers, standardizers, resins, waxes, defoamers, antidust agents, extenders, antistats, preservatives, dryness retarders, wetters, antioxidants, UV absorbers, and light stabilizers, preferably in an amount of 0.1% to 15% by weight, more particularly 0.5% to 10% by weight, based on the total weight of the pigment preparation.

Suitable surfactants include customary anionic, cationic, nonionic or amphoteric substances or mixtures of these agents.

The pigment preparations of the invention can be employed in principle for pigmenting all high molecular mass organic materials of natural or synthetic origin, as for example plastics, resins, coatings, especially metallic coatings, paints, electrophotographic toners and developers, electret materials, color filters, and also liquid inks and printing inks.

More particularly it is possible with the pigment preparations of the invention to obtain hues in the red spectrum which are in demand for use in color filters. There, the preparations provide for high contrast and for steep and narrow absorption bands.

In particular the pigment preparations of the invention are also suitable as colorants in inkjet inks on an aqueous or nonaqueous basis, and also in those inks which operate in accordance with the hotmelt process.

The present invention accordingly also provides a high molecular mass organic material comprising a coloristically effective amount of a pigment preparation of the invention.

Based on the high molecular mass organic material to be pigmented, the pigment preparation of the invention is used usually in an amount of 0.01% to 30% by weight, preferably 0.1% to 15% by weight. In the case of use in color filters, higher amounts can also be used, as mentioned hereinbelow.

The pigment preparations of the invention are suitable in particular as colorants for color filters for both additive and subtractive color generation, as for example in electro optical systems such as TV screens, LCDs (liquid crystal displays), charge coupled devices, plasma displays or electroluminescent displays, which in turn may be active (twisted nematic) or passive (supertwisted nematic) ferroelectric displays or light-emitting diodes, and also as colorants for electronic inks ("e-inks") or electronic paper ("e-paper").

Color filters—not only reflective but also transparent color filters—are produced by applying pigments in paste form or as pigmented photoresists in suitable binders (acrylates, acrylic esters, polyimides, polyvinyl alcohols, epoxides, polyesters, melamines, gelatine, caseines) to the respective LCD components (e.g., TFT-LCD=Thin Film Transistor Liquid Crystal Displays or, e.g., (S) TN-LCD=(Super) Twisted Nematic LCDs). Furthermore, the pigmented color filters may also be applied by inkjet printing techniques or other suitable printing techniques.

The red hues of the pigment preparations of the invention are especially suitable for the red-green-blue (R,G,B) color filter color set. These three colors are present side by side as separate colored dots, and produce a full color picture on illumination from behind.

Typical colorants for the blue color dot are phthalocyanine colorants or benzimidazolonedioxazine pigments such as, for example, C.I. Pigment Blue 15:6 and C.I. Pigment Blue 80. For the green color dot, phthalocyanine colorants are typically used, such as C.I. Pigment Green 36 and C.I. Pigment Green 7, for example. The red hue is preferably blended from P.R. 254 and P.R. 177 or from P.R. 254 and P.R. 242.

When needed, further colors may be admixed as well to the respective colored dots for the purpose of shading. For the red and green hues it is preferred to carry out blending with yellow, as for example with C.I. Pigment Yellow 138, 139, 150, 151, 180, and 213. For the blue hue, blending with violet is preferred, such as with C.I. Pigment Violet 19 or 23, for example.

The concentration in which the pigment preparation of the invention is used in the applied color filter film can be between 5% and 95% by weight, preferably between 20% and 80% by weight, very preferably between 40% and 60% by weight, based on the total weight of the color filter film.

The invention also provides a color filter comprising a coloristically effective amount of the pigment preparation of the invention.

In the examples hereinbelow percentages are by weight and parts are by weight unless indicated otherwise.

EXAMPLE A

Dispersant VI a) Diazo (Mixture 1):

89.6 parts of 2-amino-4-chloro-5-methylbenzenesulfonic acid are dissolved in 400 parts of water and 41 parts of aqueous sodium hydroxide solution (w=33%). Diazotization is carried out with 162 parts of hydrochloric acid (w=31%) and 73 parts of sodium nitrite solution (w=40%) at 10° C. Then 50 parts of sodium acetate are added to establish a pH of 3-4.

b) Coupler (Mixture 2):

In 1600 parts of water and 98 parts of 33% strength aqueous sodium hydroxide solution, 79 parts of BONS (3-hydroxynaphthalene-2-carboxylic acid) are dissolved. The solution is cooled to 10° C. by addition of ice.

c) Coupling:

Mixture 1 is added in 90 minutes at 15° C. to mixture 2. Stirring is carried out first at 30° C. for an hour and then at 60° C. for an hour. The resulting deep-red suspension is filtered and the filter product is washed and dried in a forced-air drying oven at 80° C. This gives 160 parts of dispersant (VI).

EXAMPLES B TO U

The dispersants (VII) to (XXVI) are prepared in the same way as in example A.

EXAMPLE 1

PV Fast Red D3G (Clariant) is subjected to salt kneading. For that purpose 14 g of the dry pigment, 1.4 g of pigment dispersant (27), produced along the lines of EP-A-1 104 789, example 10a, and 1.4 g of dispersant (VI) are kneaded with 90 g of sodium chloride and 22 ml of diethylene glycol at a temperature of 80° C. for 24 h. The kneaded dough is stirred in 0.9 l of 5% strength hydrochloric acid for two hours and then the pigment is isolated by filtration.

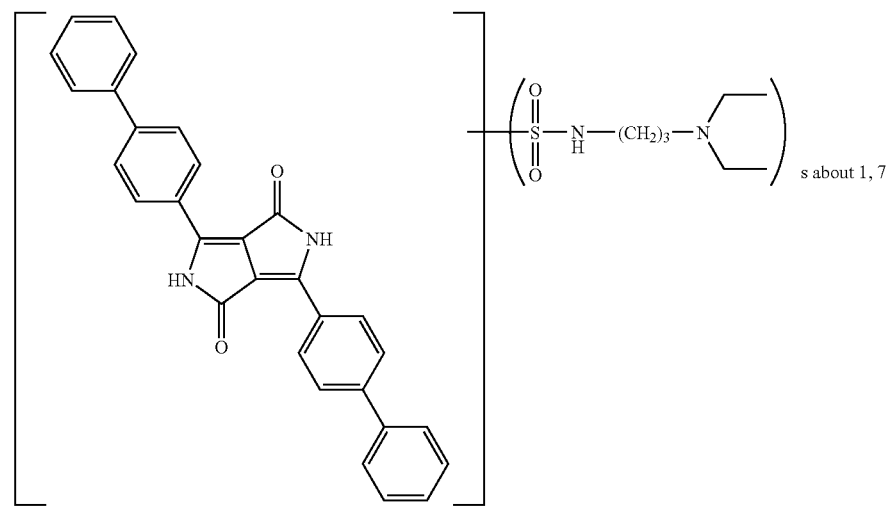

(27)

-continued (VI)

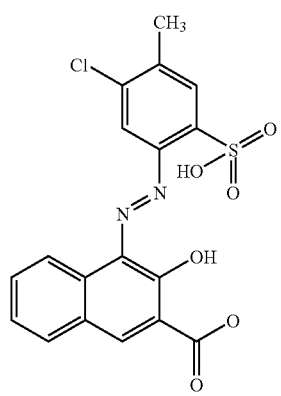

The filter cake is treated again for 1 h with stirring with 0.9 l of demineralized water. Following filtration, the pigment is washed salt-free and acid-free with water and is dried under reduced pressure.

EXAMPLE 2

In the same way as in example 1, 1.4 g of pigment dispersant (27) and 1.4 g of dispersant (VII) are used in the kneading operation. The product is a red pigment composition.

(VII)

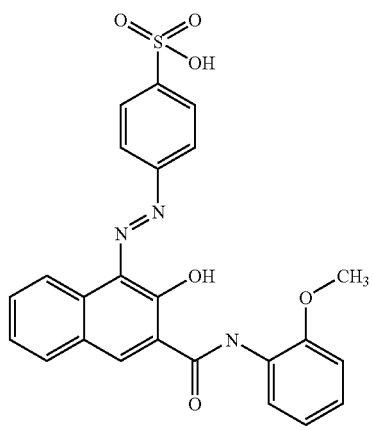

EXAMPLE 3

In the same way as in example 1, 1.4 g of pigment dispersant (27) and 1.4 g of dispersant (XI) are used in the kneading operation. The product is a red pigment composition.

(XI)

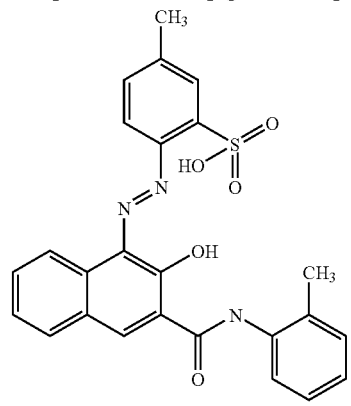

EXAMPLE 4

In the same way as in example 1, 1.4 g of pigment dispersant (27) and 1.4 g of dispersant (XIII) are used in the kneading operation. The product is a red pigment composition.

(XIII)

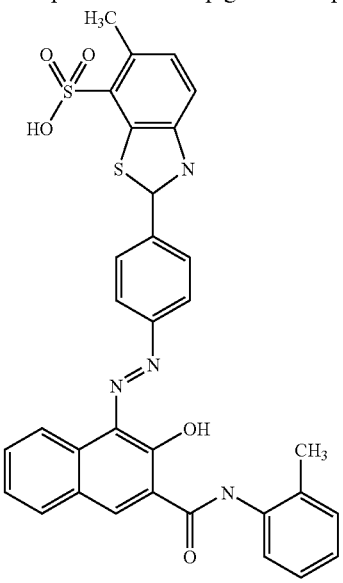

EXAMPLE 5

In the same way as in example 1, 1.4 g of pigment dispersant (27) and 1.4 g of dispersant (XIV) are used in the kneading operation. The product is a red pigment composition.

(XIV)

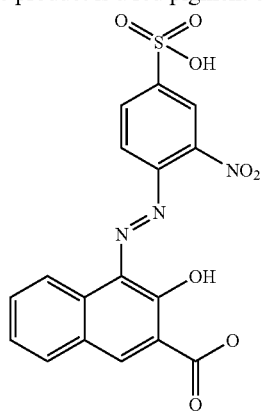

EXAMPLE 6

In the same way as in example 1, 1.4 g of pigment dispersant (27) and 1.4 g of dispersant (XIX) are used in the kneading operation. The product is a red pigment composition.

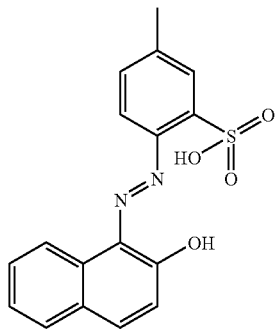

(XIX)

EXAMPLE 7

In the same way as in example 1, 1.4 g of pigment dispersant (27) and 1.4 g of dispersant (XX) are used in the kneading operation. The product is a red pigment composition.

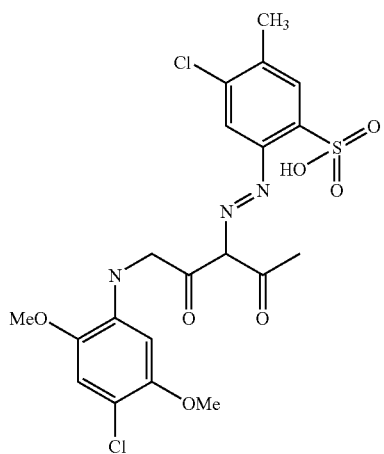

(XX)

EXAMPLE 8

In the same way as in example 1, 1.4 g of pigment dispersant (27) and 1.4 g of dispersant (XXIV) are used in the kneading operation. The produc is a red pigment composition.

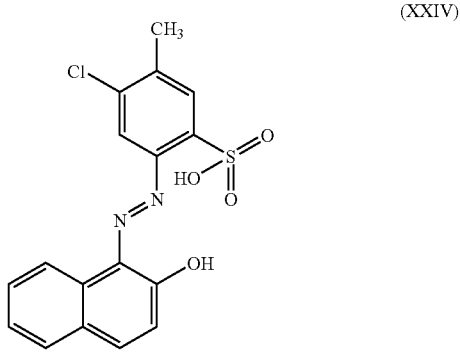

(XXIV)

EXAMPLE 9

In a salt kneading operation like that of example 1, 1.4 g of pigment dispersant (28), prepared along the lines of EP-A-3 106 906, example 1, and 1.4 g of dispersant (VI) are used. The product is a red pigment composition.

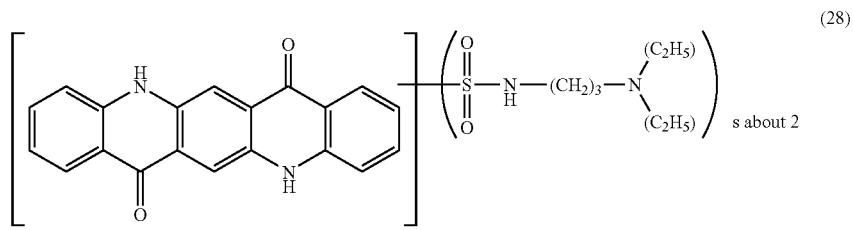

(28)

-continued

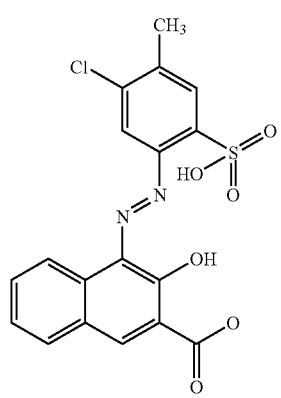
(VI)

EXAMPLE 10

In the same way as in example 9, 1.4 g of pigment dispersant (28) and 1.4 g of dispersant (VII) are used in the kneading operation. The product is a red pigment composition.

EXAMPLE 11

In the same way as in example 9, 1.4 g of pigment dispersant (28) and 1.4 g of dispersant (X) are used in the kneading operation. The product is a red pigment composition.

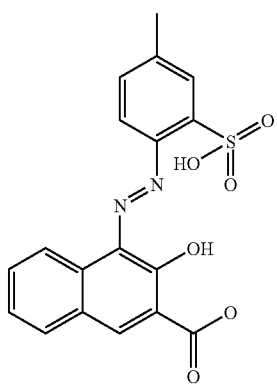
(XV)

EXAMPLE 13

In the same way as in example 9, 1.4 g of pigment dispersant (28) and 1.4 g of dispersant (XXIII) are used in the kneading operation. The product is a red pigment composition.

(X)

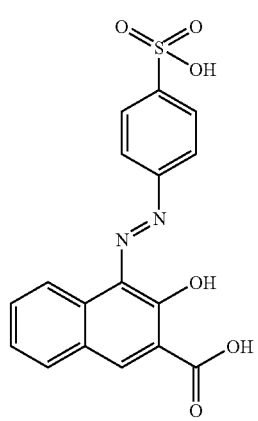
(XXIII)

EXAMPLE 12

In the same way as in example 9, 1.4 g of pigment dispersant (28) and 1.4 g of dispersant (XV) are used in the kneading operation. The product is a red pigment composition.

EXAMPLE 14

In the same way as in example 1, 0.7 g of pigment dispersant (27) and 0.7 g of dispersant (VI) are used in the kneading operation. The product is a red pigment composition.

EXAMPLE 15

In the same way as in example 1, 2.1 g of pigment dispersant (27) and 2.1 g of dispersant (VI) are used in the kneading operation. The product is a red pigment composition.

COMPARATIVE EXAMPLE 1

In analogy to example 1, only the 1.4 g of dispersant (VI) are used in the kneading operation. The product is a red pigment composition.

COMPARATIVE EXAMPLE 2

In analogy to example 2, only the 1.4 g of dispersant (VII) are used in the kneading operation. The product is a red pigment composition.

Application in Color Filers:

7.6 g of pigment or pigment composition are admixed with 1.8 g of Solsperse 24000 (Avecia) and 42 g of PGMEA. Addition of 122 g of zirconium oxide beads (0.5-0.7 mm) is followed by dispersion in a paint shaker for two hours. The millbase thus obtained is measured with a Haake RS75 cone and plate viscometer at 20° C. (DIN 53019, determination of viscosity and of thixotropy). The millbase obtained is admixed with mixture of 7.2 g of Joncryl® 611 (styrene-acrylate resin, Johnson Polymers) in 13.4 g of PGMEA and dispersed again in the paint shaker for 10 minutes. The pigment dispersion is applied with the aid of a spincoater (PO-LOS Wafer Spinner) to glass plates (SCHOTT, laser cut, 10×10 cm) and the contrast value is measured (DMS 803 goniometer, CCD-SPECT2 spectrograph).

| Sample | Viscosity/ mPas | Viscosity/ 5 days mPas | Thixotropy/ Pas | Contrast value |
|---|---|---|---|---|
| Example 1 | 16 | 21 | 4 | 2741 |
| Example 2 | 22 | 37 | 2 | 2806 |
| Example 3 | 35 | 42 | 5 | 2413 |
| Example 4 | 46 | 50 | 10 | 2566 |
| Example 5 | 21 | 25 | 8 | 2745 |
| Example 6 | 33 | 45 | 11 | 2231 |
| Example 7 | 28 | 34 | 3 | 2347 |
| Example 8 | 51 | 56 | 7 | 2563 |
| Example 9 | 19 | 35 | 17 | 2617 |
| Example 10 | 27 | 38 | 3 | 2165 |
| Example 11 | 33 | 43 | 4 | 2445 |
| Example 12 | 23 | 26 | 13 | 2391 |
| Example 13 | 27 | 34 | 2 | 2677 |
| Example 14 | 65 | 79 | 22 | 2215 |
| Example 15 | 12 | 20 | 3 | 2834 |
| Comparative example 1 | 88 | 179 | 3462 | 1819 |
| Comparative example 2 | 50 | 146 | 2045 | 2034 |

By virtue of their high contrast value and the low viscosity and thixotropy of the millbase, the pigment compositions from examples 1 to 15 are very suitable indeed for color filter applications.

What is claimed is:

1. A pigment preparation comprising
   (a) C.I. Pigment Red 254 with an average particle size $d_{50}$ of not more than 100 nm;
   (b) 0.1% to 30% by weight, based on the weight of the C.I. Pigment Red 254, of one or more dispersants from the the unlaked sulfa-containing monoazo dyes of the formula (I), (II), (III) or (IV)

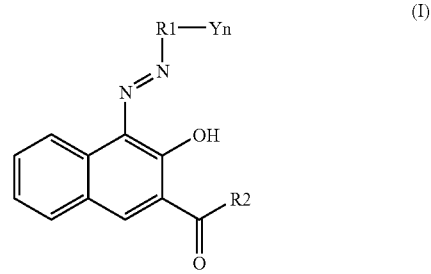

(I)

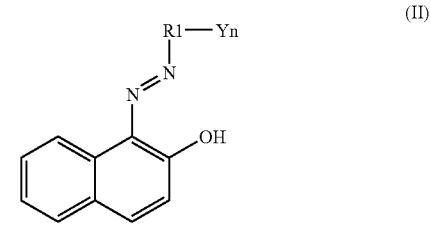

(II)

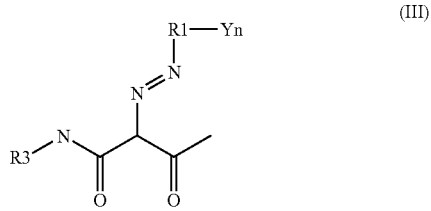

(III)

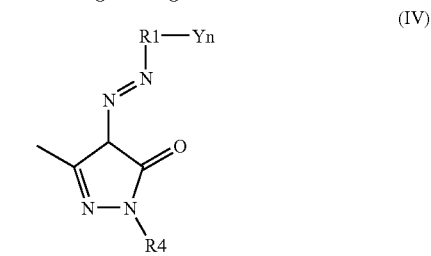

(IV)

wherein

R1 is an aromatic radical having 1, 2 or 3 aromatic rings, optionally, the rings are fused or linked by a bond, or a heterocyclic radical having 1, 2 or 3 rings containing 1, 2, 3 or 4 heteroatoms selected from the group consisting of O, N, S and a combination thereof;

optionally, the aromatic and heteroaromatic radicals are substituted by 1, 2, 3 or 4 substituents selected from the group consisting of OH, CN, F, Cl, Br, $NO_2$, $CF_3$, $C_1$-$C_6$-alkoxy, S—$C_1$-$C_6$-alkyl, $NHCONH_2$, $NHC(NH)NH_2$, NHCO—$C_1$-$C_6$-alkyl, $C_1$-$C_6$-alkyl, COOR5, CONR5R6, NR5R6, $SO_3$R5, $SO_2$—NR5R6 and $COO^-$ $E^+$, R5 and R6 being alike or different and are hydrogen, phenyl or $C_1$-$C_6$-alkyl, and $E^+$ is hydrogen, lithium, sodium, potassium, rubidium, cesium or an unsubstituted ammonium ion;

Y is $SO_3^-E^+$ or Z-$SO_3^-E^+$, Z is $C_1$-$C_{10}$-alkylene or phenylene;

n is a number 1, 2 or 3;

R2 is —OR$^8$ or —NHR$^8$,
where R$^8$ is H, $C_1$-$C_6$-alkyl, benzyl, an aromatic radical having 1, 2 or 3 aromatic rings, optionally, the rings are fused or linked by a bond, or a heterocyclic radical having 1, 2 or 3 rings containing 1, 2, 3 or 4 heteroatoms selected from the group consisting of O, N, S and a combination thereof;

optionally, the stated aromatic and heteroaromatic radicals are substituted in each case by 1, 2, 3 or 4 substituents selected from the group consisting of OH, $C_1$-$C_6$-alkoxy, S—$C_1$-$C_6$-alkyl, halogen, NHCONH$_2$, NHC(NH)NH$_2$, NHCO—$C_1$-$C_6$-alkyl, $C_1$-$C_6$-alkyl, nitro, COOR5, CONR5R6, SO$_3$R5, SO$_2$—NR5R6, NR$^9$R$^{10}$, SO$_3^-$E$^+$ and COO$^-$E$^+$, R5 and R6 being alike or different and are hydrogen, phenyl or $C_1$-$C_6$-alkyl; R$^9$ and R$^{10}$ are alike or different and are hydrogen, phenyl or $C_1$-$C_6$-alkyl;

R3 and R4 are each an aromatic radical having 1, 2 or 3 aromatic rings, optionally, the rings are fused or linked by a bond, or a heterocyclic radical having 1, 2 or 3 rings containing 1, 2, 3 or 4 heteroatoms selected from the group consisting of O, N, S and a combination thereof;

optionally for the aromatic and heteroaromatic radicals are substituted in each case by 1, 2, 3 or 4 substituents selected from the group consisting of OH, $C_1$-$C_6$-alkoxy, S—$C_1$-$C_6$-alkyl, halogen, NHCONH$_2$, NHC(NH)NH$_2$, NHCO—$C_1$-$C_6$-alkyl, $C_1$-$C_6$-alkyl, nitro, COOR5, CONR5R6, SO$_3$R5, SO$_2$—NR5R6, NR$^9$R$^{10}$, SO$_3^-$E$^+$ and COO$^-$E$^+$, R5 and R6 being alike or different and are hydrogen, phenyl or $C_1$-$C_6$-alkyl; R$^9$ and R$^{10}$ are alike or different and are hydrogen, phenyl or $C_1$-$C_6$-alkyl;

(c) 0.1% to 30% by weight, based on the weight of the C.I. Pigment Red 254, of a basic pigment dispersant of the formula (5)

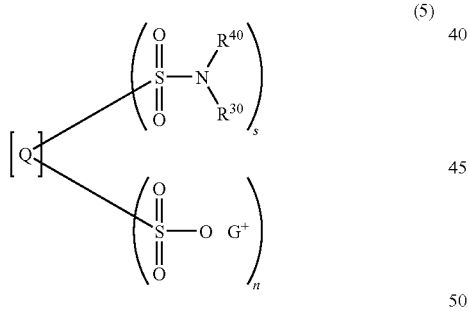

(5)

wherein

Q is a radical of an organic pigment selected from the group consisting of the perinone, quinacridone, quinacridonequinone, anthanthrone, indanthrone, dioxazine, diketopyrrolopyrrole, indigo, thioindigo, thiazineindigo, isoindoline, isoindolinone, pyranthrone, isoviolanthrone, flavanthrone and anthrapyrimidine pigments;

s is a number from 1 to 5;

n is a number from 0 to 4; the sum of s and n is 1 to 5, and s is greater than n;

R$^{30}$ is a branched or unbranched, saturated or unsaturated, aliphatic hydrocarbon radical having 1 to 20 carbon atoms, or a $C_5$-$C_7$-cycloalkyl radical, or an aralphatic or aromatic radical having 1, 2 or 3 aromatic rings, optionally the rings are fused or linked by a bond, or a heterocyclic radical having 1, 2 or 3 rings containing 1, 2, 3 or 4 heteroatoms selected from the group consisting of O, N and S and a combination thereof; the hydrocarbon, cycloalkyl, aromatic, aralphatic, and heteroaromatic radicals are, optionally substituted by 1, 2, 3 or 4 substituents selected from the group consisting of OH, CN, F, Cl, Br, NO$_2$, CF$_3$, $C_1$-$C_6$-alkoxy, S—$C_1$-$C_6$-alkyl, NHCONH$_2$, NHC(NH)NH$_2$, NHCO—$C_1$-$C_6$-alkyl, $C_1$-$C_6$-alkyl, CONR$^5$R$^6$, NR$^5$R$^6$ and SO$_2$—NR$^5$R$^6$, R$^5$ and R$^6$ being alike or different and are hydrogen, phenyl or $C_1$-$C_6$-alkyl, with the proviso that there is at least one basic amino group in the hydrocarbon, cycloalkyl, aromatic, aralphatic or heteroaromatic radicals;

R$^{40}$ is hydrogen or R$^{30}$;

G$^+$ is H$^+$, alkali metal or substituted or unsubstituted ammonium ion.

2. The pigment preparation as claimed in claim 1, wherein
Q is a radical of C.I. Pigment Red 255, or of C.I. Pigment Red 264, C.I. Pigment Violet 19 or Pigment Red 122;
R$^{30}$ is $C_2$-$C_4$-alkyl substituted by NR$^5$R$^6$, R$^5$ and R$^6$ being alike or different and are hydrogen or $C_1$-$C_4$-alkyl;
R$^{40}$ is hydrogen; and
G$^+$ is hydrogen, Li, Na, K or an ammonium ion.

3. The pigment preparation as claimed in claim 1, wherein the radical R2 is OH or O—$C_1$-$C_6$-alkyl.

4. The pigment preparation as claimed in claim 1, wherein the radical —CO—R2 is an amide group where R2 is NH$_2$,

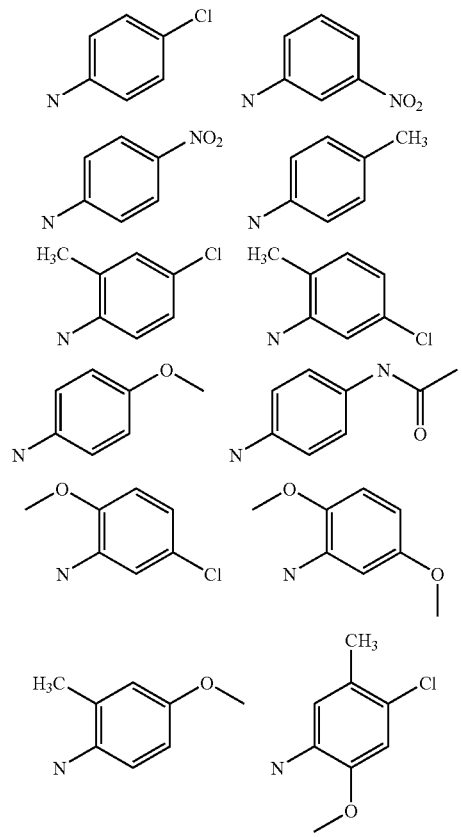

-continued

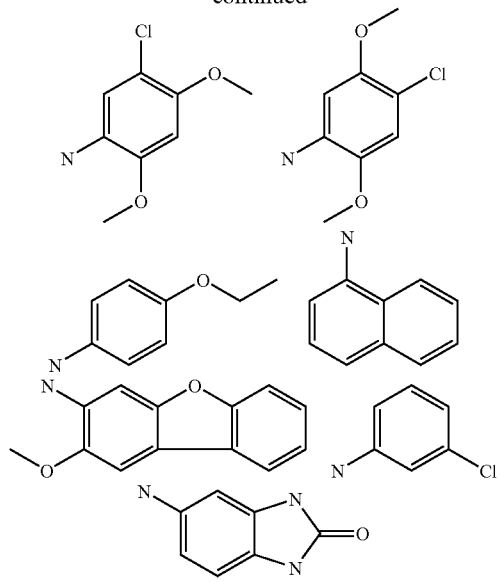

and in the above formulae the bond to the carbonyl group is via the free amino group N- of the aromatic ring.

5. The pigment preparation as claimed in claim 1, wherein the weight ratio of components b) and c) to one another is approximately 1:1.

6. A process for producing a pigment preparation as claimed in claim 1, comprising the steps of admixing the C.I. Pigment Red 254, during or after conversion, or both to a fine state of subdivision, or during or after a finishing treatment, with the unlaked sulfo-containing monoazo dye and the pigment dispersant of the formula (5).

7. A pigment article pigmented by the pigment preparation of claim 1, wherein the article is selected from the group consisting of plastics, resins, coatings, metallic coatings, paints, electrophotographic toners, electrophotographic developers, electret materials, color filters, liquid inks, inkjet inks, and printing inks.

8. A color filter comprising a coloristically effective amount of a pigment preparation as claimed in claim 1.

* * * * *